US012000903B2

(12) United States Patent
Schmidt (10) Patent No.: US 12,000,903 B2
(45) Date of Patent: Jun. 4, 2024

(54) IMPEDANCE DETERMINATION WITH PHASE DETERMINATION

(71) Applicant: Bayerische Motoren Werke Aktiengesellschaft, Munich (DE)

(72) Inventor: Jan Philipp Schmidt, Holzmaden (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 173 days.

(21) Appl. No.: 17/770,771

(22) PCT Filed: Oct. 23, 2020

(86) PCT No.: PCT/EP2020/079947
§ 371 (c)(1),
(2) Date: Apr. 21, 2022

(87) PCT Pub. No.: WO2021/083813
PCT Pub. Date: May 6, 2021

(65) Prior Publication Data
US 2022/0365142 A1 Nov. 17, 2022

(30) Foreign Application Priority Data
Oct. 31, 2019 (DE) ..................... 10 2019 129 449.5

(51) Int. Cl.
*G01R 31/389* (2019.01)
*G01R 31/367* (2019.01)

(52) U.S. Cl.
CPC ......... *G01R 31/389* (2019.01); *G01R 31/367* (2019.01)

(58) Field of Classification Search
None
See application file for complete search history.

(56) References Cited

U.S. PATENT DOCUMENTS

2012/0032688 A1\* 2/2012 Christophersen .... G01R 31/389
324/612
2013/0264999 A1 10/2013 Srinivasan et al.
(Continued)

FOREIGN PATENT DOCUMENTS

CN 106940403 B 5/2019
DE 10 2013 103 921 A1 11/2013
(Continued)

OTHER PUBLICATIONS

International Search Report (PCT/ISA/210) issued in PCT Application No. PCT/EP2020/079947 dated Jan. 20, 2021 with English translation (four (4) pages).
(Continued)

*Primary Examiner* — Jas A Sanghera
(74) *Attorney, Agent, or Firm* — Crowell & Moring LLP (57) ABSTRACT

A method for the correction of synchronization errors $\Delta t$ in the measurement of the impedance of an electrical or electrochemical component, more particularly a lithium ion cell is provided. In general, synchronization errors in an impedance measurement can arise between the excitation and response signals, which can misrepresent the phase of the impedance value obtained. According to the method, the synchronization error can be determined by measuring the impedance at two different frequencies and solving an optimization problem in respect of the deviation of the phases from an equivalent circuit diagram, which comprises at least one resistance and an inductance. The phase of the impedance value obtained can be corrected in this way.

11 Claims, 4 Drawing Sheets

(56) References Cited

U.S. PATENT DOCUMENTS

| | | |
|---|---|---|
| 2013/0307487 A1 | 11/2013 | Matthe et al. |
| 2015/0352972 A1 | 12/2015 | Li |
| 2017/0045588 A1 | 2/2017 | Aoki et al. |
| 2019/0064284 A1 | 2/2019 | Christophersen et al. |
| 2019/0221893 A1 | 7/2019 | Marsili et al. |

FOREIGN PATENT DOCUMENTS

| | | |
|---|---|---|
| DE | 10 2015 107 930 A1 | 12/2015 |
| DE | 10 2018 100 692 A1 | 7/2019 |
| EP | 2 667 166 A2 | 11/2013 |
| WO | WO 2016/106501 A1 | 7/2016 |

OTHER PUBLICATIONS

German-language Written Opinion (PCT/ISA/237) issued in PCT Application No. PCT/EP2020/079947 dated Jan. 20, 2021 (six (6) pages).

German-language Search Report issued in German Application No. 10 2019 129 449.5 dated Oct. 2, 2020 with partial English translation (10 pages).

\* cited by examiner

IMPEDANCE DETERMINATION WITH PHASE DETERMINATION

BACKGROUND AND SUMMARY OF THE INVENTION

The present invention relates to a method for phase determination in the course of impedance calculation, specifically in the course of measuring the impedance of a lithium ion cell.

Electrochemical impedance spectroscopy (EIS) is an established method for characterizing electrochemical systems such as, in particular, galvanic cells, which generally includes the measurement of the impedance, i.e. of the complex impedance, as a function of the frequency of the impedance.

In the prior art it is known to use impedance measurements or impedance spectroscopy for diagnosing the state of lithium ion cells and, in particular, also to determine the temperature of a lithium ion cell with the aid of the impedance.

DE 10 2013 103 921 relates to the cell temperature measurement and degradation measurement in lithium battery systems of electrically operated vehicles by determining the cell impedance on the basis of an AC voltage signal predefined by an inverter. The method is based on the observation that the profile of the plot of impedance versus signal frequency is temperature-dependent.

EP 2 667 166 A2 relates to a method for determining temperature by way of measuring the imaginary part of the impedance at a plurality of frequencies and ascertaining the frequency at which the imaginary part has a zero crossing. The method is based on the observation that the frequency of the zero crossing for a given state of charge and state of health of the cell is substantially dependent on the temperature.

US 2013/0264999 relates to a battery charging system comprising a temperature sensor that is alternately connected to the individual cells to be charged in a time division multiplexing method in order to measure the impedance of the cell and to ascertain the temperature from the phase of the impedance. In that case, the rate of change of temperature over time serves as an indicator of whether the cell has been fully charged.

What all these methods have in common is that to determine the temperature it is necessary to determine not just the absolute value of the impedance but rather the impedance as a complex variable (i.e. absolute value and phase or real part and imaginary part).

The excitation is generally carried out galvanostatically (i.e. as a current signal with a defined amplitude); the voltage signal caused thereby is measured and the impedance is calculated from the amplitudes and phases of the two signals. In principle, two methods are conceivable here for excitation.

Firstly, each cell can be excited individually with the aid of the balancing current. In this case, the cell monitoring unit (cell supervision circuit, CSC), which also performs the charge balancing between the cells, impresses the excitation signal on the balancing current and simultaneously measures the high-frequency portion of the falling voltage in order to calculate the impedance therefrom. This has the advantage that very accurate phase information is obtained since the generation of the excitation signal, the recording of the measurement signal and the impedance calculation are carried out by the same control unit. Disadvantages are the high current consumption and the stringent requirements in respect of the accuracy of the voltage measurement.

Alternatively, the excitation can be impressed externally, for example via the inverter or the DC-DC converter. This enables a higher excitation signal level, as a result of which the signal/noise ratio (S/N ratio) is improved and the requirements in respect of the voltage measurement accuracy are reduced. In addition, the current consumption and the outlay in terms of apparatus are reduced since the individual cell monitoring units need no longer be provided with dedicated excitation circuits, and the impedance calculation from the measured voltage signal can be carried out externally in a separate control unit.

Particularly in the case of methods with external excitation in which the signals are processed by different control units, there is the risk of synchronization errors occurring between excitation signal and response signal, as a result of which the precision of the temperature determination deteriorates. In this regard, an asynchronism of 10 μs already leads to a phase error of 3.6°. If e.g. the temperature of a cell is intended to be determined from the phase of the impedance, then e.g. for a 60 Ah cell at 300 Hz a phase accuracy of 3.6° leads to a temperature inaccuracy of 7.2 K.

In view of the problems referred to above, there is a need for a method for the phase calibration of excitation and response signals, such that even for the case where the signals are beset by a synchronization error Δt, a determination of the impedance with high phase accuracy can be carried out in order to enable an accurate temperature determination.

In order to achieve this object, an embodiment of the present invention provides a phase calibration method, and also an impedance measuring method that uses this calibration method.

The method according to an embodiment of the invention can advantageously be used in conjunction with external excitation. The energy demand during the impedance measurement and the impedance measuring quality can be improved by way of the method according to an embodiment of the invention. At the same time the method allows a decentralized architecture in which generation of the excitation signal and voltage measurement with impedance calculation can be present separately from one another, without stringent requirements being made of the synchronism of both systems.

The present invention relates to a method for correcting synchronization errors Δt in the course of the measurement of the impedance of an electrical or electrochemical component, in particular of a lithium ion cell, comprising:

choosing an impedance model for the component, which has at least one resistance R and an inductance L;

applying one or more excitation signals I(t) or U(t) with at least two frequencies $f_1$ and respectively $f_2$;

measuring a response signal U(t+Δt) or I(t+Δt), which can be beset by a synchronization error ΔT relative to the excitation signal;

determining the impedance $Z_1$ and $Z_2$ at $f_1$ and respectively $f_2$ from the excitation signal and the response signal;

determining Δt as that value for which the deviation between the difference $Z_{diff} = Z_2 - Z_1$ between the measured values and the corresponding value of $Z_{diff}$ that is calculated for the equivalent circuit diagram falls below a predetermined threshold value in respect of at least one impedance component;

correcting the impedance values using the ascertained synchronization error Δt.

In the method according to an embodiment of the invention, a plurality of excitation signals with different frequencies can be applied alternately, or one excitation signal containing a superposition of a plurality of frequencies can be used.

The at least two frequencies $f_1$ and respectively $f_2$ which are used for ascertaining the synchronization error $\Delta t$ are preferably 1 kHz or greater, such that the capacitive contributions to the impedance are negligible and the impedance model comprises only resistances and inductances.

The synchronization error $\Delta t$ determined by the method according to an embodiment of the invention can preferably also be used for the correction of impedance measurements at one or more frequencies $f_0$ that are lower than $f_1$ and respectively $f_2$.

DETAILED DESCRIPTION OF THE DRAWINGS

Basic Principles

In order to introduce the terminology, the basic principles of impedance measurement are summarized briefly below. The explanations concern the galvanostatic case, which is usually relevant in practice and in which an alternating current signal $I(t)$ with known amplitude $I_0$ and known frequency f is supplied, and the falling voltage $U(t)$ is measured. However, the explanations are correspondingly applicable to the opposite case as well, i.e. supply of a predetermined voltage signal and measurement of the current, which is likewise possible.

The signals $I(t)$ and $U(t)$ can be represented in the complex number plane as $$I(t) = I_0 * e^{i\omega t}$$

$$U(t) = U_0 * e^{i(\omega t + \phi)}$$

Hereinafter both the frequency f and the angular frequency $\omega = 2\pi f$ may be referred to in a summarizing way as "frequency", provided from the context or the symbol $\omega/f$ used it is clear which frequency is meant.

The signals $I(t)$ and $U(t)$ are generally phase-shifted in relation to one another by the phase angle $\phi$, which is defined as the zero point angle of voltage and current. The impedance Z is calculated as $U(t)/I(t)$ and is complex for the case where $\phi$ is not equal to zero:

$$Z = U(t)/I(t) = (U_0/I_0) * e^{i\phi}$$
$$= Z_0 * (\cos\phi + i * \sin\phi)$$
$$= R + iX$$

The real part Re(Z)=R corresponds to the ohmic resistance and is also referred to as the true resistance. The imaginary part Im(Z)=X arises as a result of the phase shift and is also referred to as the reactance.

The absolute value of the impedance |Z| is the ratio of the root-mean-square current and voltage amplitudes and is also referred to as the apparent impedance. It includes both the true resistance and the reactance and is typically frequency-dependent. Power is dissipated only owing to the true resistance, however.

For an ideal ohmic resistance, the phase shift is zero and the impedance corresponds to the true resistance R. For an ideal capacitor (capacitive reactance), the phase shift is $-90°$, and the impedance is purely imaginary and decreases as the frequency increases ($Z=-i*(1/\omega C)$; C: capacitance). For an ideal inductive component (inductive reactance), the phase shift is $+90°$. The impedance is likewise purely imaginary and amounts to $Z=+i\omega L$ (L: inductance), i.e. the reactance increases as the frequency increases.

According to an embodiment of the invention, the impedance measurement is used in particular for detecting the state (temperature, state of charge, etc.) of a lithium ion cell. Most processes in the cell that are based on charge transfer, including ionic conduction in the electrolyte and the kinetics of intercalation and deintercalation at the electrodes, can be described here by ohmic resistances. Capacitive reactances occur for example at the electrical double layers at the electrodes. Consequently, the cell can be modelled approximately by an equivalent circuit diagram having at least one RC element for representing the electrode processes and, connected in series therewith, a series resistance $R_0$ for representing the electrolyte resistance ("$R_0$-RC model").

Inductances are less relevant to the electrochemical processes themselves and essentially arise as a result of the magnetic fields in the electrical conductors involved (current collectors, supply leads, cabling). Overall, the inductance of the arrangement at relatively high frequencies, as viewed in absolute terms, can supply a considerable portion to the phase shift. However, since the arrangement is fixed and is not influenced by the electrochemical processes in the cell, this portion can be treated as a (frequency-dependent) apparatus constant and thus be eliminated from calculations for the cell state to be diagnosed. At high frequencies, however, the contribution of L dominates the impedance. Therefore, particularly at high frequencies, the equivalent circuit diagram for representing the impedance should furthermore be supplemented by a series inductance L ("L-$R_0$-RC model").

Synchronization Method

The signals $I(t)$ and $U(t)$ may generally be beset by a synchronization error, i.e. the signals $I(t)$ and $U(t)$ are not recorded synchronously, rather the time zero points are shifted in relation to one another by an indefinite time difference $\Delta t$, for example a few µs. Consequently, in reality $I(t)$ and $U(t+\Delta t)$, rather than $I(t)$ and $U(t)$, are used for the impedance calculation. The phase angle $\phi_{meas}$ thus measured is therefore corrupted by a phase error $\Delta\phi$ relative to the correct phase shift $\phi$:

$$\phi meas = \phi + \Delta\phi$$

$$\Delta\phi = \omega * \Delta t = 2\pi f * \Delta t$$

The impedance value actually measured (i.e. calculated from the signals I(t) and U(t) beset by a synchronization error) is accordingly:

$$Z_{meas} = (U_0/I_0) * e^{i\phi meas} = (U_0/I_0) * e^{i(\phi+\Delta\phi)}$$
$$= Z_0 * (\cos(\phi + \Delta\phi) + i*\sin(\phi + \Delta\phi))$$

Put simply, the method according to an embodiment of the invention essentially utilizes the inductance of the arrangement and the frequency dependance of the resulting inductive reactance in order to synchronize the signals U(t) and I(t). In this case, the frequencies are preferably chosen with a sufficient magnitude such that the capacitive contributions become negligible and the impedance is determined by the inductive and ohmic contributions.

Accordingly, the method according to an embodiment of the invention is illustrated firstly for the case of a pure L-R model representing an approximation for the behavior of the cell at high frequencies.

As explained above, the cell can be approximately represented generally as an L-$R_0$-RC model. The impedance of the RC element $Z_{RC}(\omega)$ is frequency-dependent and amounts to:

$$Z_{RC}(\omega) = R/(1 + i\omega + RC)$$
$$= R/(1 + (\omega RC)^2) - i\omega R^2 C/(1 + (\omega RC)^2)$$

Consequently, $Z_{RC}(\omega)$ vanishes at high frequencies, and the series resistance $R_0$ and the inductance L remain, such that the behavior of the cell corresponds to an LR model.

$$Z_{R-L(\omega)} = R_0 + i\omega L$$

According to an embodiment of the invention, the impedance is measured at at least two frequencies $f_1$ and $f_2$ (or $\omega_1$ and $\omega_2$) and the difference $Z_{diff} = Z_2 - Z_1$ is formed. Afterward, $\Delta t$ is determined as that value for which the deviation between the difference $Z_{diff} = Z_2 - Z_1$ between the measured values and the corresponding value of $Z_{diff}$ that is calculated for the equivalent circuit diagram falls below a predetermined threshold value in respect of at least one impedance component.

Since $R_0$ is frequency-independent, the real part vanishes during the difference formation in the pure L-R model, and a purely imaginary component remains.

$$Z_{diff} = Z_2 - Z_1 = iL(\omega_2 - \omega_1)$$

In the representation of Z, the real part corresponds to the cosine terms, i.e. the synchronization error can be determined as that point at which the difference between the cosine terms vanishes:

$$Re(Z_{diff}) = Z_{0,diff}(\cos(\phi 2 + \Delta\phi 2) - \cos(\phi 1 + \Delta\phi 1)) = 0$$

Consequently, in this case the asynchronism $\Delta t$ can be calculated as that value at which the difference between the real parts vanishes, which can be carried out analytically or numerically. This has the advantage that the model parameters R and L do not have to be known, since the above considerations in the pure L-R model hold true for any choice of L and R.

The corrected impedance values can then be calculated by rotating the phases of $Z_1$ and $Z_2$ by $\Delta_{\phi 1} = 2\pi f_1 * \Delta t$ and respectively $\Delta_{\phi 2} = 2\pi f_2 * \Delta t$.

This consideration was based on a pure L-R model, which can be justified for the case where both frequencies $f_1$ and $f_2$ are high enough such that the capacitive contributions become negligible, for example approximately 1 kHz or more.

Figure 1:
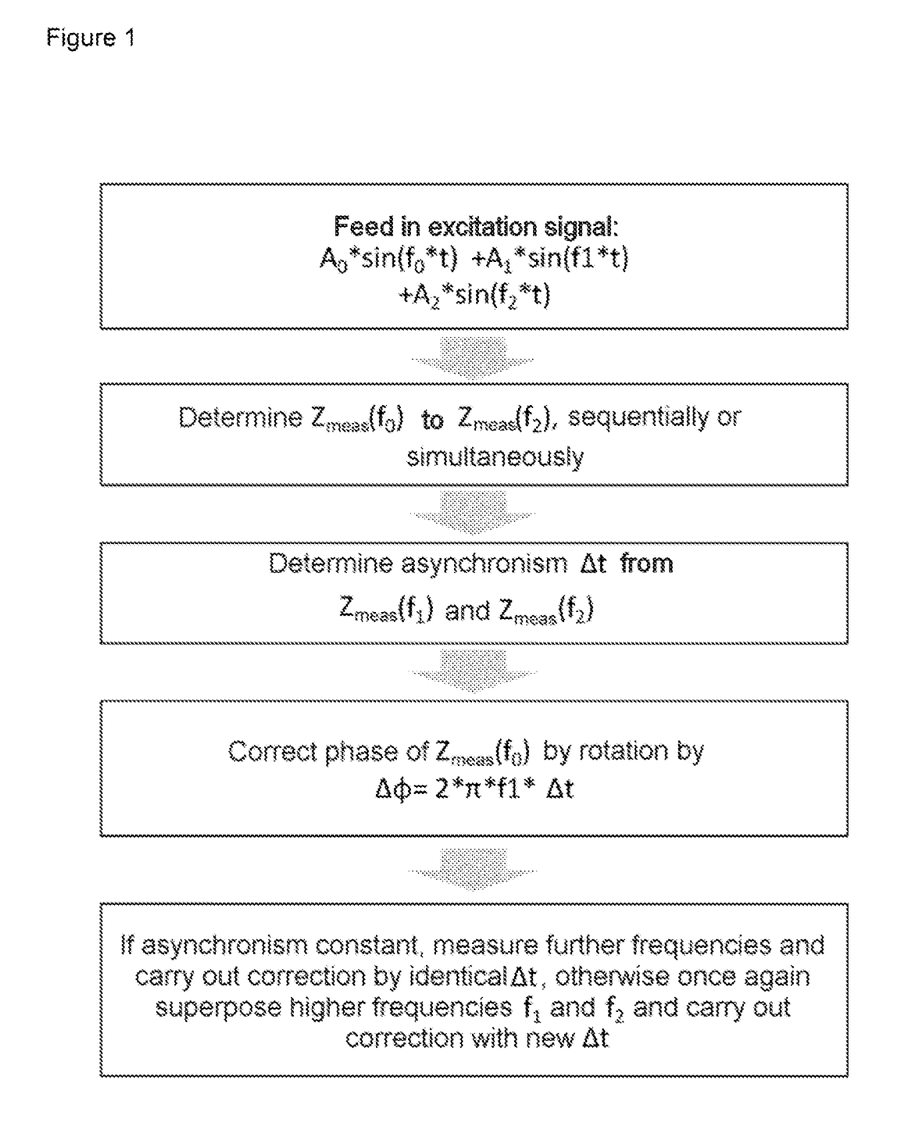
FIG. 1 shows the general sequence of the method according to an embodiment of the invention for the case where the impedance is measured at three frequencies $f_0$, $f_1$ and $f_2$, and the measured values at $f_1$ and $f_2$, assuming an LR model, are used for the determination of $\Delta t$.

Diagnosing the cell state, in particular the electrode processes, may necessitate carrying out an impedance measurement at one or a plurality of lower frequencies $f_0$, which is or are for example in the range of 10 to 300 Hz, preferably approximately 30 to 200 Hz, in which capacitive contributions are not negligible. In this case, the method according to an embodiment of the invention can nevertheless be carried out at frequencies $f_1$ and $f_2$ of above 1 kHz for which the L-R model can be formulated, and the value thus obtained for $\Delta t$ is subsequently used for the correction of the impedance at $f_0$. FIG. 1 schematically shows one such method in which three frequencies $f_0$, $f_1$ and $f_2$ are used, but only $f_1$ and $f_2$ are used for the determination of $\Delta t$.

Furthermore, if appropriate, even more complex impedance models may be necessary, for example through extension with an additional resistance (R-LR model). Finally, it may also become necessary to explicitly take account of the capacitive contributions, for instance if in respect of the outlay on apparatus there is an upper limit regarding the available frequencies.

In these cases, more complex impedance models should be provided, which can contain further elements such as ohmic resistances R, capacitances C or LR elements, or optionally also Warburg elements. In order to ascertain $\Delta t$ by minimizing the deviation with respect to the equivalent circuit diagram, the values of the model parameters (R, L, etc.) typically have to be known. For this purpose, the model parameters can for example be ascertained with high precision in a separate measurement and be stored, and the method according to an embodiment of the invention can be carried out using the model parameters predetermined in this way.

Alternatively, it is also possible for some or all of the model parameters also to be determined simultaneously with $\Delta t$ in the context of the method according to an embodiment of the invention. This involves a numerical optimization problem, the system having, as degrees of freedom, the synchronization error $\Delta t$ and also the model parameters to be determined. Accordingly, in this case the number of frequency points $f_1$, $f_2$, etc. or measured impedance values $Z_1$, $Z_2$ should preferably be exactly equal to or greater than the number of degrees of freedom in order that the system is determined or overdetermined. The solution to the optimization problem is effected on the basis of the system of equations that arises for the impedance at the different frequencies, and is effected according to methods known per se.

Figure 2:
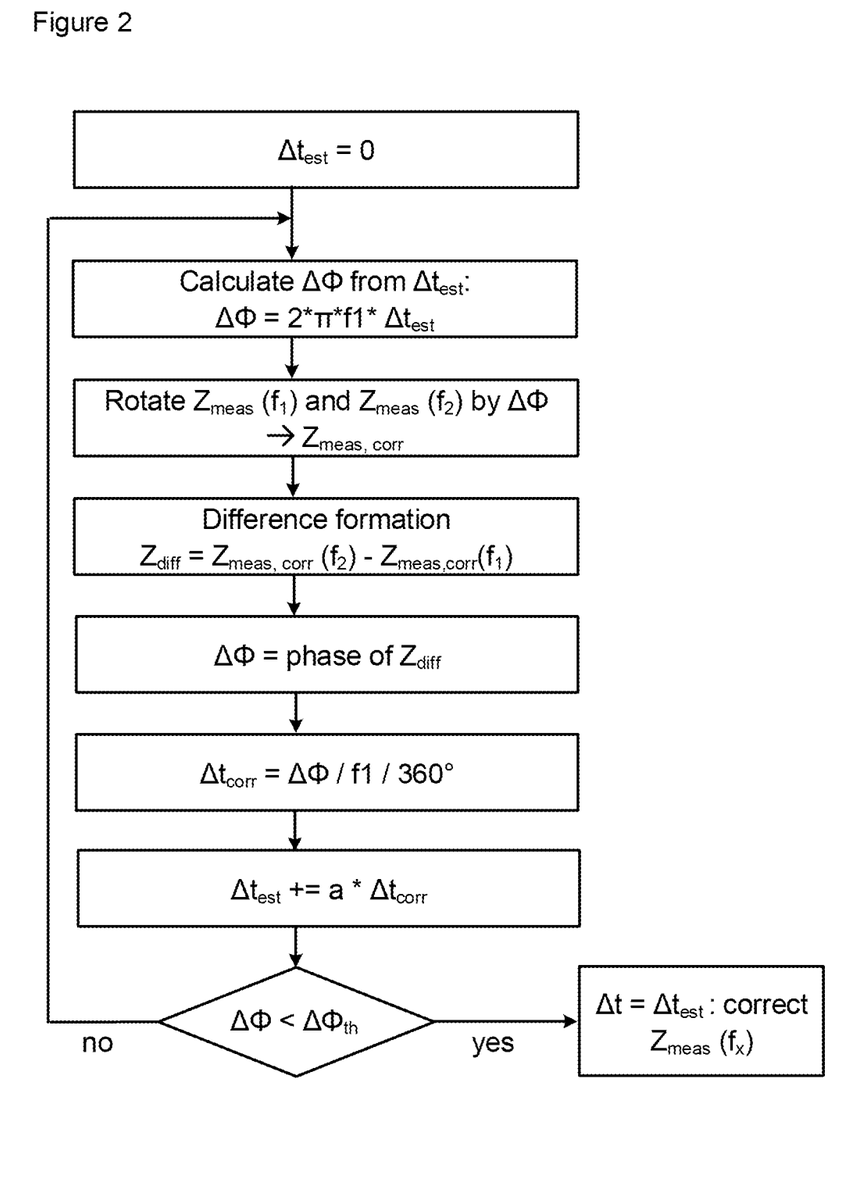
FIG. 2 shows the flow chart of one embodiment of the method according to the invention, wherein $\Delta t$ is determined by way of an iterative control algorithm.

In one possible embodiment, in this case, the optimization is effected by way of an iterative control algorithm on the basis of the difference $Z_{diff}$ between the measured impedances $Z_1$ and $Z_2$, wherein the phase of $Z_{diff}$, weighted with a proportional factor a, indicates the step size of the iteration, as shown in FIG. 2. In this case, in each iteration the difference $Z_{diff} = Z_2 - Z_1$ is calculated, from the phase of $Z_{diff}$ a differential $\Delta t_{corr}$ is calculated and accumulated, and with the accumulated value the phase of $Z_2$ and $Z_1$ is in turn corrected.

The individual steps are as follows:

1. Initialization with $\Delta t = 0$; in each pass a differential $\Delta t_{corr}$ is calculated and added in order to obtain at the end an estimated value for $\Delta t$.

2. Calculating of $\Delta_{\phi 1}$ and respectively $\Delta_{\phi 2}$ from the present value of $\Delta t$ as $\Delta_{\phi 1,2} = 2\phi f_{1,2} * \Delta t$.
3. Rotating the raw (i.e. beset by the synchronization error $\Delta t$) measured values $Z_{meas}(f_1)$ and $Z_{meas}(f_2)$ by $\Delta_{\phi 1}$ and respectively $\Delta_{99\ 2}$ in order to obtain phase-corrected measured values $Z_{meas,corr}(f_1)$ and respectively $Z_{meas,corr}(f_2)$.
4. Forming the difference $Z_{diff} = Z_{meas,corr}(f_2) - Z_{meas,corr}(f_2)$.
5. Determining the phase $\Delta_{\phi diff}$ of $Z_{diff}$.
6. Determining a correction term $\Delta t_{corr} = \Delta_{\phi diff}/2\pi f_1$.
7. Incrementing the value for $\Delta t$ by $\Delta t_{corr}$, weighted with a factor a.
8. Repeating steps 2 to 7 with the incremented value for $\Delta t$ until $\Delta_{\phi diff}$ falls below a specific threshold value.
9. Obtaining the corrected impedance values from the calculated $\Delta t$.

The weighting factor a controls the step size of the iteration, and can be chosen suitably, for instance in the interval of 0.1 to 1.0, in order firstly to enable a rapid convergence and secondly to prevent an oscillation of the accumulated value of $\Delta t$ around the actual value. It is also possible to adapt a in each iteration to the respective differential value $\Delta t_{corr}$. The frequencies $f_1$ and $f_2$ preferably have a sufficient magnitude such that the capacitive terms become negligible and an LR model can be formulated, for example 1 kHz or more. However, the $\Delta t$ calculated from $f_1$ and $f_2$ can be used for correcting the synchronization for lower frequencies $f_0$, for which the pure LR behavior no longer holds true.

Figure 3:
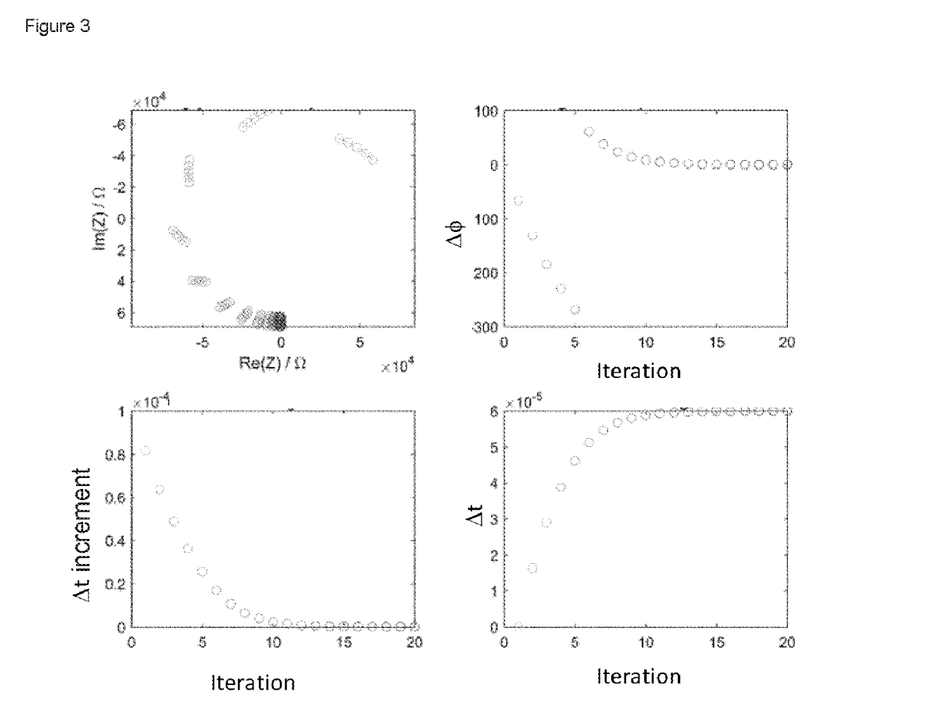
FIG. 3 shows the convergence behavior of the algorithm outlined schematically in FIG. 2. At the top left, real and imaginary parts of the impedance at five different frequencies are plotted in a Nyquist plot for increasing convergence of $\Delta t$ (in the counterclockwise direction). At the top right, the profile of the phase difference versus the number of iterations is plotted. In the bottom two plots, the differential change of $\Delta t$ (left) and the accumulated value of $\Delta t$ (right) are plotted against the number of iterations.

FIG. 3 shows the convergence behavior of the algorithm. At the top left, real and imaginary parts of the impedance at five different frequencies are plotted in a Nyquist plot for increasing convergence of $\Delta t$ (in the counterclockwise direction). At the top right, the profile of the phase difference versus the number of iterations is plotted. In the bottom two plots, the differential change of $\Delta t$ (left) and the accumulated value of $\Delta t$ (right) are plotted against the number of iterations.

Implementation

The method according to an embodiment of the invention can be used in particular for improving the accuracy of the impedance measurement in the context of the monitoring and state diagnosis of cells, in particular lithium ion cells, in a battery system.

In particular, this can involve a battery system for an electrically or hybrid-electrically operated vehicle. Such a battery system comprises a plurality of lithium ion cells that are supervised by a battery management system (BMS).

The cells are typically interconnected in groups serially and/or in parallel to form battery packs and in each case connected to a cell monitoring unit (CSC), which at least monitors the cell voltage and also controls the charge balancing. In this case, each individual cell can be provided with a cell monitoring unit, or a plurality of cells can be connected to a cell monitoring unit. The latter can have a plurality of input channels for voltage measurement in order to be able to simultaneously monitor the cells connected thereto, or the monitoring can be effected by way of a multiplexing method. The totality of the cells and cell monitoring units is in turn monitored by a battery management unit (BCU, battery control unit).

Preferably, the excitation signal for the impedance measurement is impressed as an alternating current signal, which can be effected cell by cell, e.g. by way of the balancing current, or globally from outside, e.g. via the inverter. The response signal can be recorded by the voltage monitoring function of the CSCs. As set out above, there is the risk of synchronization errors particularly in the case of global external excitation, and so the method according to an embodiment of the invention is preferably suitable for this application.

Figure 4:
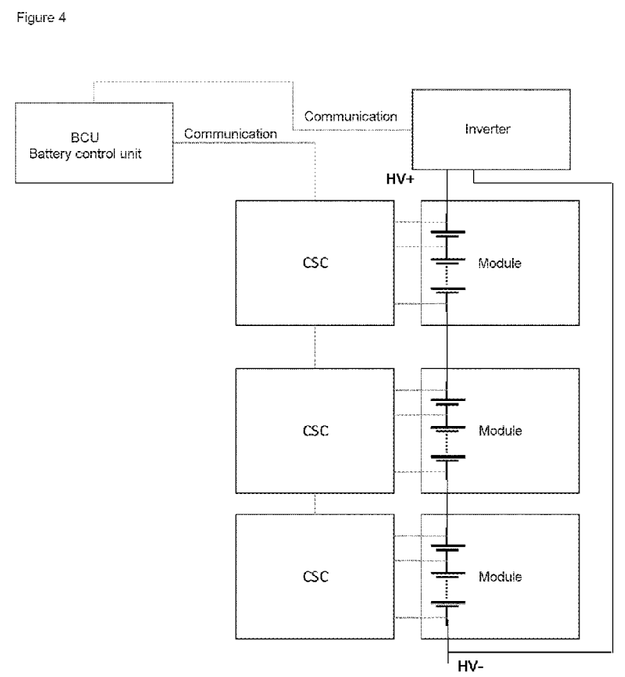
FIG. 4 shows a battery system provided for carrying out the method according to an embodiment of the invention.

FIG. 4 schematically shows one example of a battery system for an electrically operated vehicle in which the method according to an embodiment of the invention can be used. Therein a plurality of cells are in each case interconnected to form modules, and each module is provided with a CSC, which monitors the voltage of the cells in the module. The modules are in turn connected in series. The excitation signal is impressed on the current globally by the inverter, and the response signal is recorded by the CSCs.

The calculation of the impedance and the carrying out of the method according to an embodiment of the invention can likewise be effected by the CSCs, especially since $\Delta t$ can be different for each cell or for each module. Alternatively, the recorded response signal can be communicated to the BCU, which then performs the carrying out of the method according to an embodiment of the invention and the calculation of the impedance. In order to avoid an overload of the communication channels, a calculation of the impedance in the CSCs is preferred.

The frequencies $f_1$ and $f_2$, and also depending on the complexity of the model and the desired precision optionally further frequencies $f_3$, $f_4$, . . . , which are used for determining $\Delta t$, preferably have a sufficient magnitude such that the capacitive contributions become negligible. By way of example, frequencies of 1 kHz to 20 kHz can be used. The frequencies have predetermined spacings with respect to one another, which can be for example 100 Hz to 5 kHz, preferably 500 Hz to 2 kHz or 1 kHz to 2 kHz. Besides the determination of $\Delta t$, the impedance values at the frequencies $f_1$, $f_2$, etc. can also be used for determining the electrolyte resistance.

By contrast, for the characterization of the electrode processes, the contribution of which to the impedance can be described by RC elements, one or more lower frequencies $f_0$ are preferred, in the case of which the capacitive contributions are no longer negligible, and which lie for example in the range of the inverse time constants of the RC elements involved. These frequencies $f_0$ can be for example 10 to 300 Hz, preferably 20 to 200 Hz. With regard to the simplicity of the impedance model, it is preferred not to use the frequencies $f_0$ for determining $\Delta t$ by way of the method according to an embodiment of the invention. Conversely, by contrast, the calculated value of $\Delta t$ can be used for correcting the impedance at $f_0$.

An excitation signal can be used which has simultaneously just a single frequency, which is varied. Preferably, however, a superposition of a plurality or all of the required frequencies $f_1$ and $f_2$ and also optionally $f_0$ and/or $f_3$, $f_4$, etc. is used.

The invention claimed is:

1. A method for determining an impedance of an electrical or electrochemical component with correction of a synchronization error, the method comprising:
choosing an impedance model for the component, which has a resistance and an inductance;
applying an excitation signal with a first frequency and a second frequency;
measuring a response signal, which is beset by the synchronization error relative to the excitation signal;
determining a first impedance at the first frequency and a second impedance at the second frequency from the excitation signal and the response signal;

determining the synchronization error as a value for which a deviation between a difference between the second impedance and the first impedance and a corresponding value of an impedance difference that is calculated for an equivalent circuit diagram falls below a predetermined threshold value in respect of at least one impedance component; and correcting values of the first impedance and the second impedance using the synchronization error.

2. The method of claim 1, wherein the component is a lithium ion cell.

3. The method according to claim 1, wherein:
determining the synchronization error is carried out iteratively,
in each iteration the difference is calculated,
from a phase of the difference a differential is calculated and accumulated, and
from an accumulated value a phase of the first impedance and the second impedance is corrected.

4. The method according to claim 1, wherein the first frequency and the second frequency are between 1 kHz and 20 kHz.

5. The method according to claim 1, further comprising determining an impedance at one or more further frequencies that are lower than the first and the second frequency.

6. The method according to claim 5, wherein the one or more further frequencies are between 10 and 300 Hz.

7. The method according to claim 5, wherein the excitation signal comprises a superposition of the first frequency, the second frequency, and the one or more further frequencies.

8. The method according to claim 1, wherein the excitation signal comprises a superposition of the first frequency and the second frequency.

9. A battery system comprising:
a plurality of lithium ion cells, wherein individual cells or blocks composed of a plurality of cells connected in parallel are connected in series;
one or more signal generators that are configured to apply the excitation signal;
one or more cell monitoring units that are configured to monitor a cell voltage of the lithium ion cells and to record the response signal; and
one or more computing units that are configured to carry out the method according to claim 1.

10. The battery system according to claim 9, wherein the one or more signal generators comprise a single signal generator, which impresses the excitation signal globally on a total current.

11. The battery system according to claim 9, wherein the one or more computing units are integrated into the one or more cell monitoring units.

* * * * *